(12) United States Patent
Halimaoui et al.

(10) Patent No.: US 9,330,957 B2
(45) Date of Patent: May 3, 2016

(54) PROCESS FOR ASSEMBLING TWO WAFERS AND CORRESPONDING DEVICE

(75) Inventors: Aomar Halimaoui, La Terrasse (FR); Marc Zussy, Sainte Egréve (FR)

(73) Assignees: STMICROELECTRONICS (CROLLES 2) SAS, Crolles (FR); COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 421 days.

(21) Appl. No.: 13/330,146

(22) Filed: Dec. 19, 2011

(65) Prior Publication Data
US 2012/0161292 A1    Jun. 28, 2012

(30) Foreign Application Priority Data
Dec. 20, 2010    (FR) ..................................... 10 60839

(51) Int. Cl.
*H01L 21/762*    (2006.01)
(52) U.S. Cl.
CPC ............................... *H01L 21/76251* (2013.01)
(58) Field of Classification Search
CPC ............................................... H01L 21/76251
See application file for complete search history.

(56) References Cited

U.S. PATENT DOCUMENTS

| 5,665,631 | A  | * | 9/1997 | Lee et al. ....................... 438/459 |
| 6,214,702 | B1 | * | 4/2001 | Kim ............................... 438/459 |
| 6,513,564 | B2 | * | 2/2003 | Bryan et al. ................... 156/755 |
| 6,624,047 | B1 | * | 9/2003 | Sakaguchi et al. ............ 438/458 |
| 6,830,985 | B2 | * | 12/2004 | Oi et al. ......................... 438/401 |
| 6,844,242 | B2 | * | 1/2005 | Naruoka et al. ............... 438/455 |
| 6,872,979 | B2 | * | 3/2005 | Yoshida et al. ................. 257/70 |
| 7,727,860 | B2 | * | 6/2010 | Miyazaki et al. ............. 438/459 |
| 8,628,674 | B2 | * | 1/2014 | Zussy et al. ..................... 216/36 |
| 2001/0055863 | A1 | * | 12/2001 | Nakano et al. ................ 438/549 |
| 2002/0023725 | A1 | * | 2/2002 | Bryan et al. ................... 156/584 |
| 2003/0148595 | A1 | * | 8/2003 | Yoshida et al. ............... 438/517 |
| 2004/0206444 | A1 |   | 10/2004 | Letertre et al. ................ 156/182 |
| 2007/0072393 | A1 | * | 3/2007 | Aspar et al. ................... 438/459 |
| 2009/0203167 | A1 | * | 8/2009 | Mitani .......................... 438/106 |

FOREIGN PATENT DOCUMENTS

| EP | 1887613 | 5/2006 | ............. H01L 21/02 |
| EP | 1962325 | 11/2006 | ............. H01L 21/02 |
| FR | 2860842 | 10/2003 | ............... F16B 5/00 |

* cited by examiner

*Primary Examiner* — Matthew W Such
*Assistant Examiner* — Abul Kalam
(74) *Attorney, Agent, or Firm* — Allen, Dyer, Doppelt, Milbrath & Gilchrist, P.A.

(57) ABSTRACT

A process for assembling a first wafer and a second wafer each bevelled on their peripheries includes excavating the bevelled peripheral part of at least one first side of the first wafer to create a deposit bordering the region excavated in the material of the first wafer. The first side and a second side of the second wafer are then bonded together.

15 Claims, 5 Drawing Sheets

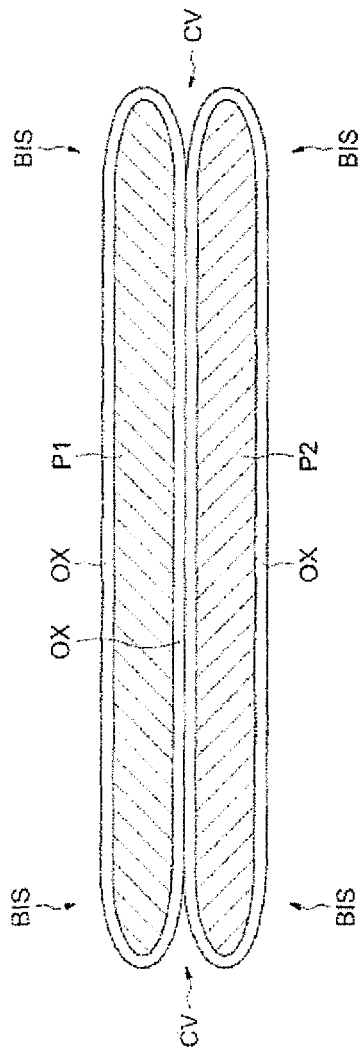
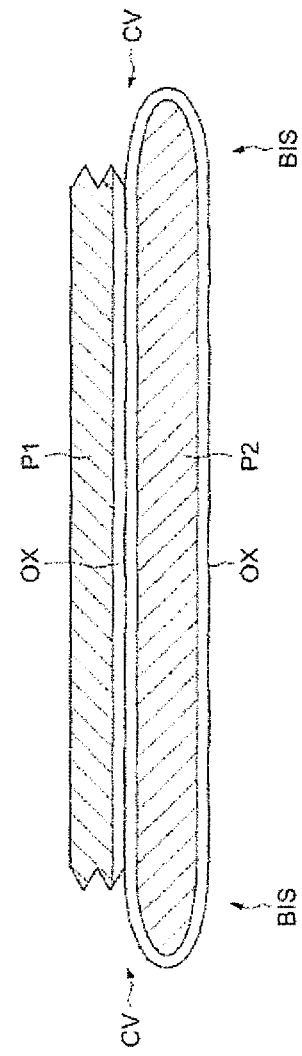
FIG.1a (PRIOR ART)
FIG.1b (PRIOR ART)

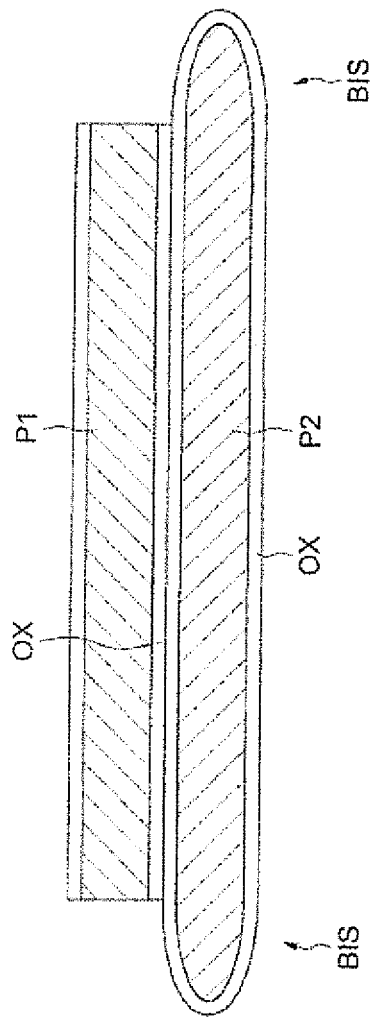
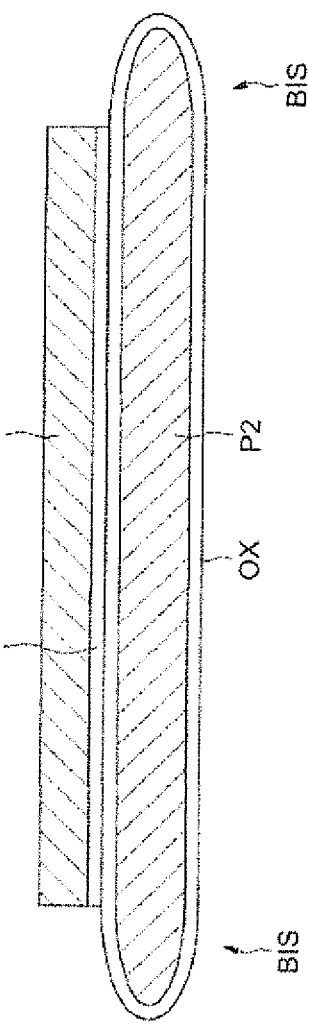
FIG.2a (PRIOR ART)
FIG.2b (PRIOR ART)

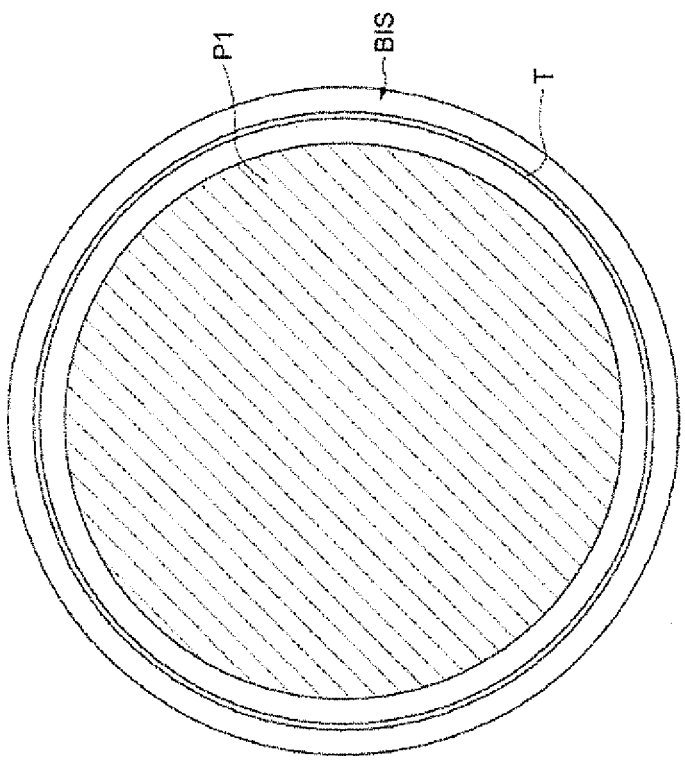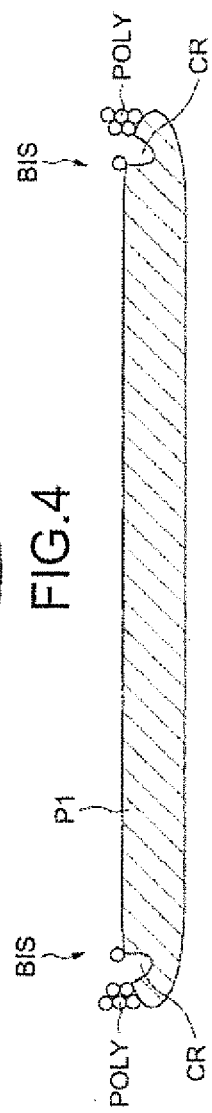

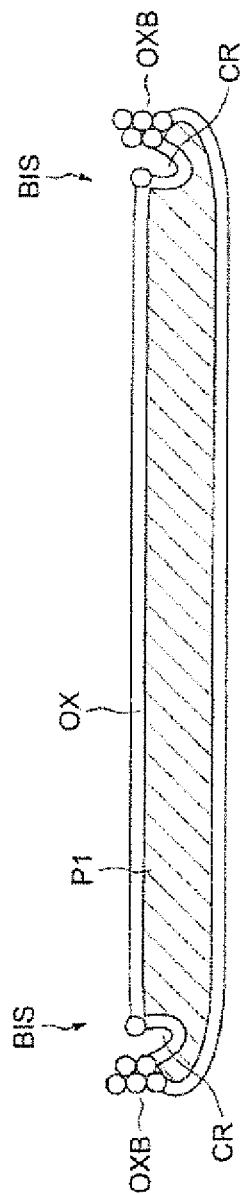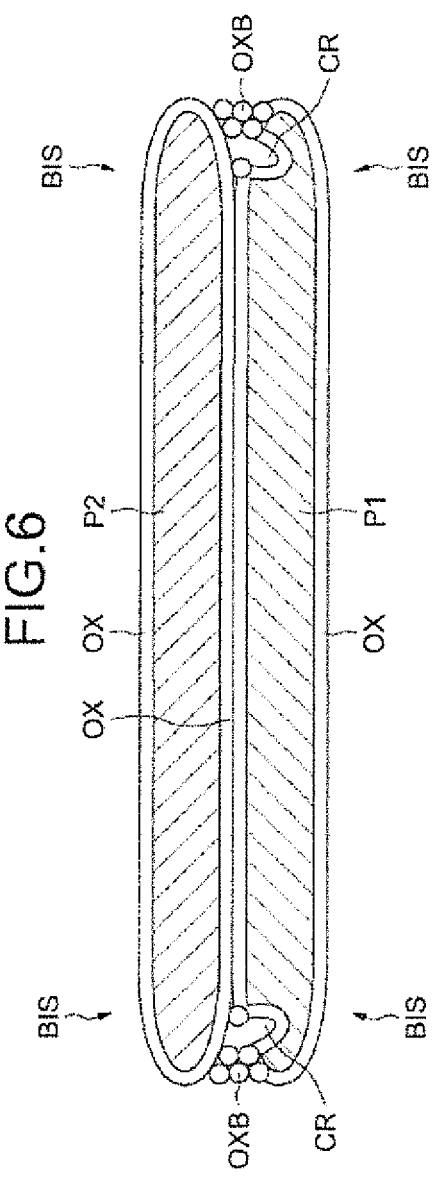

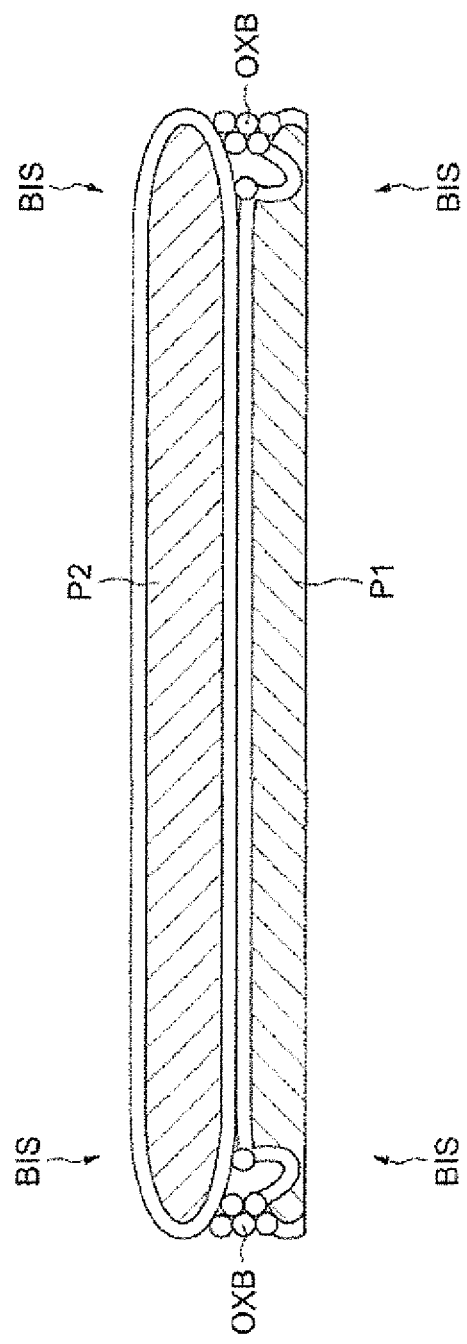

PROCESS FOR ASSEMBLING TWO WAFERS AND CORRESPONDING DEVICE

FIELD OF INVENTION

The invention relates to integrated circuits, and more particularly, to the assembly of at least two wafers used in microelectronics, especially semiconductor wafers. The wafers may be silicon wafers, for example.

BACKGROUND OF THE INVENTION

The fabrication of integrated circuits in silicon substrates may require the assembly of two silicon wafers. For example, three-dimensional structures comprise components fabricated on at least two separate wafers that are then assembled.

Mention will also be made of backlit imaging devices in which the photodetection cells are placed near the back side of the substrates in which they are fabricated. These substrates are generally thinned in mechanical polishing or grinding steps to bring the back surface of the active regions of the photodetection cells closer. To enable this thinning, a second wafer of silicon is attached to the front side of the first substrate to form a handle.

Moreover, during fabrication of three-dimensional structures, vertical through-interconnections, called TSVs (through-silicon vias), are produced through at least one silicon wafer. Generally, this silicon wafer is thinned in a mechanical polishing or grinding step to enable production of short through-silicon vias.

A conventional assembly of two wafers, for example, silicon wafers, is illustrated in FIG. 1a. In this figure, two silicon wafers P1 and P2 are schematically illustrated. To bond the two wafers, a bonding layer OX, for example, a layer of silicon dioxide ($SiO_2$), is formed on the surface of the two wafers. This may be performed, for example, in a growth step or by depositing silicon dioxide ($SiO_2$).

The two wafers P1 and P2 are generally wafers that are 200 mm or 300 mm in diameter, and they conventionally comprise a bevelled peripheral part BIS. The bevelled peripheral part BIS may extend over a portion of the wafers P1 and P2, which is about 1 mm to 3 mm in width.

After bonding, a cavity CV is formed between the bevelled peripheral parts BIS of the two wafers P1 and P2. The presence of the cavity CV has the particular drawback of not allowing the peripheral parts of the wafers to be rigidly connected to each other during bonding.

Thus, during the thinning of the wafer P1 (FIG. 1b), the edge of the wafer P1 is too fragile and may delaminate and cause the bevelled peripheral part BIS to crack. This cracking may produce splinters that can deeply scratch the surface of the wafer P1 during the thinning step, and thus represents a source of particulates.

Before bonding, it is possible to cut off the bevelled parts of the silicon wafer to be thinned (FIG. 2a) using a technique well know to those skilled in the art called edge grinding or edge trimming. In this figure, the bevelled peripheral part BIS of the wafer P1 has been trimmed, for example, mechanically trimmed, before the wafer P1 is thinned.

In FIG. 2b, the wafer P1 is shown after the thinning step. The absence of the bevelled peripheral part BIS makes it possible to obtain a thickness of about a micron without cracks appearing. Nonetheless, apart from the fact that an additional step is performed in the assembly of two wafers, the cutting may also create particles that contaminate equipment.

SUMMARY OF THE INVENTION

In view of the foregoing background, an object of the present invention is to omit the step of trimming the bevelled edges of a wafer during assembly of two wafers, especially two semiconductor wafers.

According to one aspect, a process is provided for assembling a first wafer and a second wafer each bevelled on their peripheries. The process may comprise excavating the bevelled peripheral part of at least one first side of the first wafer to create a deposit bordering the region excavated in the material of the first wafer. The first side may then be bonded to a second side of the second wafer.

The term bevelled is to be understood in a very broad sense. The term especially covers a cut at the ends of the wafers in a substantially oblique direction. The cut surface may have a profile decreasing towards the end, whether this profile is straight or rounded, for example.

The deposit bordering the region excavated in the material that formerly made up this region on the bevelled peripheral part makes it possible to fill at least partially the space between the two bevelled parts. The bonding step may comprise direct bonding of the first side and the second side.

The expression direct bonding (also sometimes called molecular bonding) is understood to mean bonding in which no adhesive is used. Bonding occurs when the two sides to be assembled are brought into contact.

The bonding may comprise, before the direct bonding, forming a bonding layer on the first side of the first wafer obtained after the excavation step, and/or on the second side of the second wafer.

The formation of the bonding layer (made of silicon oxide or silicon nitride, for example) also makes it possible to level the surfaces. This makes the subsequent direct bonding easier. Formation of the bonding layer on a wafer may comprise oxidizing the wafer. Thus, if the wafer is made of silicon, the bonding layer may be made of a layer of silicon dioxide ($SiO_2$). This may, for example, be an oxidation of the whole first wafer.

If the wafer is made of silicon, the excavation may lead to polycrystalline silicon being deposited so that it borders the excavated region. Since the polycrystalline silicon may be more porous than single-crystal silicon, oxygen atoms may diffuse more rapidly into the polycrystalline silicon than into the single-crystal substrate during formation of the silicon dioxide by oxidation. The oxidation may be dry oxidation, for example. Consequently, the silicon dioxide may be thicker in the bevelled peripheral parts that comprise polycrystalline silicon.

As a variation, the bonding layer (for example, made of silicon dioxide or silicon nitride) may be formed by deposition. Thus, the cavity formed between the bevelled peripheral parts may be filled with the material of the excavated region and of the bonding layer. The bonding region between the two wafers may thus be laterally added to in this bevelled region. The bevelled peripheral part of the wafer to be thinned may be supported during the thinning step, thus preventing cracking in this peripheral part without an edge trimming step being required.

The bonding step may comprise, before the direct bonding, preparing the surfaces to be assembled to make the direct bonding easier, especially in terms of planarity, roughness and hydrophilicity. The process may furthermore comprise excavating the bevelled peripheral part of the second side. Thus, the material deposited bordering the excavated region on the two wafers contributes to filling the cavities formed between the bevelled peripheral parts.

The excavation may be produced using a laser beam. Application of this laser beam may cause the material forming the wafer to be expulsed and redeposited about the point of impact of the laser beam. If the wafer is made of silicon, the redeposited material may be polycrystalline silicon.

Advantageously, the process may further comprise thinning at least one of the two wafers.

According to another aspect, a device may be provided comprising at least two wafers bevelled at their peripheries and rigidly connected to one another. At least one of the wafers may have on its assembled side, in its bevelled periphery, an excavation having a contour that comprises a surplus of material of the excavated wafer. The side joined to the other wafer may be covered with a bonding layer. One of the two wafers may be thinner than the other.

The wafers may be made of a semiconductor, especially silicon, germanium or an III-V or II-VI semiconductor, or glass. The two wafers may comprise different materials. The bonding layer may comprise silicon dioxide ($SiO_2$) or silicon nitride ($Si_3N_4$).

BRIEF DESCRIPTION OF THE DRAWINGS

Other advantages and features of the invention will become clear on studying the detailed description of methods of implementation and embodiments, given by way of non-limiting examples and illustrated by the appended drawings in which:

FIGS. 1a, 1b, 2a and 2b schematically illustrate an assembly of two silicon wafers according to the prior art; and FIGS. 3 to 7 illustrate a method of implementation and embodiments according to the present invention.

DETAILED DESCRIPTION OF THE PREFERRED EMBODIMENTS

In FIG. 3, a schematic top view of a wafer P1 is shown. The wafer P1 is a silicon wafer, for example, comprising a bevelled peripheral part BIS. The wafer P1 may have a diameter of 200 or 300 millimeters, for example, and a thickness of 700 microns. The bevelled peripheral part BIS may extend, by way of example, 1 to 3 millimeters.

A laser beam is applied to the bevelled peripheral part BIS, for example, along the path T. The path T is a circular path (e.g., 2 or 3 mm from the edge of the wafer). However, it is also possible to follow other paths, for example, a sinusoidal path. By way of example, the path T is a continuous path but it is also possible to apply the laser beam to a discontinuous path T. By way of example, the path T may have a width of about 500 microns.

The laser used may be a laser typically used for marking reference codes in wafers, as readily known by those skilled in the art. A cross-sectional view of the wafer P1 after the laser has been applied along the path T is shown in FIG. 4.

The bevelled peripheral part BIS now comprises an excavation or crater CR (typically a few microns in depth) formed when the applied laser beam melts the silicon. During this melting, silicon grains are extracted and redeposited on the bevelled peripheral part BIS to form a polysilicon mass POLY.

During this melting, grains of silicon may or may not remain in the crater CR. But even if the crater CR does not contain any silicon grains, acceptable attachment of the bevelled peripheral parts BIS is nevertheless obtained.

The power of the laser may be adjusted to control the depth of the crater, and therefore, the amount of material redeposited to fill to the bevelled region. The amount of material redeposited my thus be greater or lesser based on the depth of the crater.

To enable bonding of the wafer P1 with another wafer, a bonding layer OX, for example, a layer of silicon dioxide, is at least formed on the upper surface of the wafer P1 by dry oxidation (FIG. 5), for example.

The polysilicon layer POLY is a porous layer which is easier for the oxygen atoms introduced during the dry oxidation to diffuse into, thereby promoting growth of the silicon dioxide. Thus, the silicon grains in the layer POLY are transformed at least partially into silicon dioxide OXB to form a layer that is thicker than the layer OX. This is because a silicon grain at least partially converted into silicon dioxide has a larger volume after conversion.

As a variation, the silicon dioxide may be deposited, for example, by chemical vapour deposition (CVD). The polysilicon mass POLY covered with silicon dioxide makes it possible to at least partially fill the cavity between the bevelled peripheral parts BIS of the wafers P1 and P2. This may, for example, be a deposit of tetraethyl orthosilicate (TEOS) having a thickness between 500 and 1000 nanometers.

This bonding layer may undergo conventional preparation steps to make the subsequent direct bonding easier, especially in terms of planarity, roughness and hydrophilicity. This preparation may comprise a chemical-mechanical polishing (CMP) step or treatment with plasma, UV or ozone.

FIG. 6 shows bonding of the wafer P1 to a silicon wafer P2 on which an optional bonding layer OX has also been formed, for example, a layer of silicon dioxide ($SiO_2$). It could also be a layer of silicon nitride ($Si_3N_4$). The layer of silicon dioxide OXB enables the cavity formed between the bevelled parts BIS of the wafers P1 and P2 to be at least partially filled. The bonding layer OX of the second wafer P2 may also have undergone the above mentioned preparation steps with a view to making the direct bonding easier.

The wafers P1 and P2 are bonded using conventional direct bonding by placing the two wafers in contact. A heat treatment step (e.g., at about 350° C. for two hours) may be used to increase the bonding energy.

The presence of the crater CR does not affect the filling of the cavity. This is because the edges of the crater on the bevelled peripheral part, covered by the silicon oxide layer OXB, are sufficiently high to meet the wafer P2. Moreover, since the layer OXB is porous, the crater CR does not form a cavity in which the gas could be encapsulated causing a defect.

During subsequent thinning of the wafer P1 (FIG. 7), no cracks appear in the bevelled peripheral parts BIS supported by the layer OXB. It is thus possible to thin the wafer P1 down to a thickness as low as about a micron. The thinning step may comprise a mechanical grinding step followed by a chemical-mechanical polishing.

A device is obtained comprising at least two wafers bevelled at their peripheries and rigidly connected to one another. At least one of which has on its assembled side, in its bevelled periphery, an excavation having a contour that comprises a surplus of material of the excavated wafer.

Of course, variations to implementations and embodiments are possible. In particular, it is possible to form a bonding layer OXB on the wafer P2 to increase the fill of the cavity. This is an analogous to that described for the wafer P1.

It is furthermore possible to assemble more than two wafers during the fabrication of three-dimensional integrated circuits. The wafer P2 may furthermore be thinned, and the wafer P1 is replaced in the thinning step.

Moreover, it is possible to assemble wafers made of different materials, whether or not a bonding layer is used. More particularly, it is possible to assemble wafers of silicon, germanium or of III-V or II-VI semiconductors, or of glass. Bonding layers made of silicon dioxide ($SiO_2$) or of silicon nitride ($Si_3N_4$) may also be used.

A certain number of steps may be implemented to make the direct bonding easier. In particular, steps of preparing the surfaces to be assembled may be implemented. This is especially so in terms of planarity, roughness and hydrophilicity.

As a result of these aspects of the invention, an assembly of silicon wafers may be obtained in which the bevelled peripheral parts of the wafers have not been trimmed, while equipment contamination during the assembly of the silicon wafers and their thinning is reduced.

That which is claimed:

1. A process for assembling a first wafer and a second wafer each bevelled on their peripheries, the process comprising:
   forming an excavated region in the bevelled periphery on a first side of the first wafer;
   saving a material from the excavated region when the excavated region is formed;
   forming a border adjacent the excavated region using the saved material from the excavated region; and
   after forming the border, bonding the first side of the first wafer and a second side of the second wafer, with the border extending in height above the first side of the first wafer so as to contact the bevelled periphery on the second side of the second wafer.

2. The process according to claim 1, wherein the bonding comprises direct bonding.

3. The process according to claim 2, wherein the bonding further comprises, before the direct bonding, forming a bonding layer on at least one of the first side of the first wafer and the second side of the second wafer.

4. The process according to claim 3, wherein the bonding layer is formed by oxidizing the wafer.

5. The process according to claim 3, wherein the bonding layer is formed by deposition.

6. The process according to claim 2, wherein the bonding further comprises, before the direct bonding, preparing surfaces of the first side of the first wafer and of the second side of the second wafer.

7. The process according to claim 1, further comprising forming an excavated region in the bevelled periphery on the second side of the second wafer.

8. The process according to claim 1, further comprising using a laser beam to form the excavated region.

9. The process according to claim 1, further comprising thinning at least one of the first and second wafers.

10. A process for forming a device comprising first and second wafers comprising:
    forming an excavated region in a periphery on a first side of the first wafer;
    saving a material from the excavated region when the excavated region is formed;
    forming a border adjacent the excavated region using the saved material from the excavated region;
    after forming the border, forming at least one bonding layer on at least one of the first side of the first wafer and a second side of the second wafer; and
    after forming the at least one bonding layer, bonding the first side of the first wafer and a second side of the second wafer, with the border extending in height above the at least one bonding layer so as to contact the periphery on the second side of the second wafer.

11. The process according to claim 10, wherein the bonding comprises direct bonding.

12. The process according to claim 10, wherein forming the at least one bonding layer comprises forming a first bonding layer on the first side of the first wafer and a second bonding layer on the second side of the second wafer.

13. The process according to claim 11, further comprising forming an excavated region in the periphery on the second side of the second wafer.

14. The process according to claim 10, further comprising using a laser beam to form the excavated region.

15. The process according to claim 1, further comprising thinning at least one of the first and second wafers.

* * * * *

UNITED STATES PATENT AND TRADEMARK OFFICE
CERTIFICATE OF CORRECTION

| | | |
|---|---|---|
| PATENT NO. | : 9,330,957 B2 | |
| APPLICATION NO. | : 13/330146 | |
| DATED | : May 3, 2016 | |
| INVENTOR(S) | : Halimaoui et al. | |

It is certified that error appears in the above-identified patent and that said Letters Patent is hereby corrected as shown below:

In the claims:

Column 6, Line 38    Delete: "Claim 1"
                     Insert: -- Claim 10 --

Signed and Sealed this
Second Day of August, 2016

Michelle K. Lee
*Director of the United States Patent and Trademark Office*